(12) United States Patent
Collins, III et al.

(10) Patent No.: US 6,547,249 B2
(45) Date of Patent: Apr. 15, 2003

(54) MONOLITHIC SERIES/PARALLEL LED ARRAYS FORMED ON HIGHLY RESISTIVE SUBSTRATES

(75) Inventors: William David Collins, III, San Jose, CA (US); Jerome Chandra Bhat, San Jose, CA (US); Daniel Alexander Steigerwald, Cupertino, CA (US)

(73) Assignee: Lumileds Lighting U.S., LLC, San Jose, CA (US)

(*) Notice: Subject to any disclaimer, the term of this patent is extended or adjusted under 35 U.S.C. 154(b) by 0 days.

(21) Appl. No.: 09/823,824

(22) Filed: Mar. 29, 2001

(65) Prior Publication Data

US 2002/0139987 A1 Oct. 3, 2002

(51) Int. Cl.$^7$ ................................................ H01L 33/00
(52) U.S. Cl. ............................ 277/88; 257/89; 257/90; 257/97; 257/98; 257/99
(58) Field of Search ................................ 257/88, 89, 90, 257/98, 97, 99

(56) References Cited

U.S. PATENT DOCUMENTS

| | | | |
|---|---|---|---|
| 3,947,840 A | 3/1976 | Craford et al. | 340/324 M |
| 4,182,025 A | 1/1980 | Wickenden | 29/577 R |
| 4,827,290 A | 5/1989 | Yoritomo et al. | 346/107 |
| 5,060,027 A | 10/1991 | Hart et al. | 357/17 |
| 5,406,095 A | 4/1995 | Koyama et al. | 257/88 |
| 5,583,349 A | * 12/1996 | Norman et al. | 257/88 |
| 5,869,221 A | * 2/1999 | Ogihara et al. | 430/311 |
| 5,952,681 A | * 9/1999 | Chen | 257/89 |
| 6,054,723 A | * 4/2000 | Tajiri et al. | 257/88 |
| 6,120,909 A | 9/2000 | Bojarczuk, Jr. et al. | 428/446 |

\* cited by examiner

Primary Examiner—Nathan J. Flynn
Assistant Examiner—Remmon R. Fordé
(74) Attorney, Agent, or Firm—Patent Law Group LLP; Rachel V. Leiterman; Brian D. Ogonowsky (57) ABSTRACT

Series or parallel LED arrays are formed on a highly resistive substrate, such that both the p- and n-contacts for the array are on the same side of the array. The individual LEDs are electrically isolated from each other by trenches or by ion implantation. Interconnects deposited on the array connects the contacts of the individual LEDs in the array. In some embodiments, the LEDs are III-nitride devices formed on sapphire substrates. In one embodiment, two LEDs formed on a single substrate are connected in antiparallel to form a monolithic electrostatic discharge protection circuit. In one embodiment, multiple LEDs formed on a single substrate are connected in series. In one embodiment, multiple LEDs formed on a single substrate are connected in parallel. In some embodiments, a layer of phosphor covers a portion of the substrate on which one or more individual LEDs is formed.

24 Claims, 8 Drawing Sheets

MONOLITHIC SERIES/PARALLEL LED ARRAYS FORMED ON HIGHLY RESISTIVE SUBSTRATES

BACKGROUND

Figure 1A:
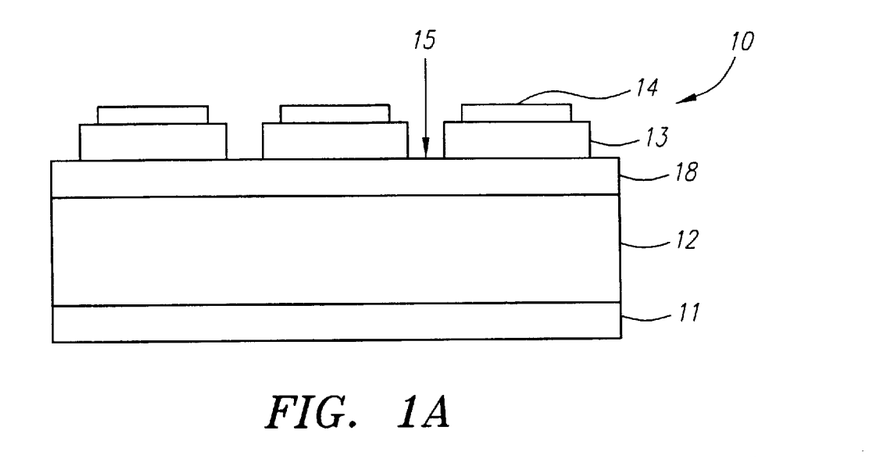
FIGS. 1A and 1B illustrate typical multiple parallel junction LED arrays.
Figure 1B:
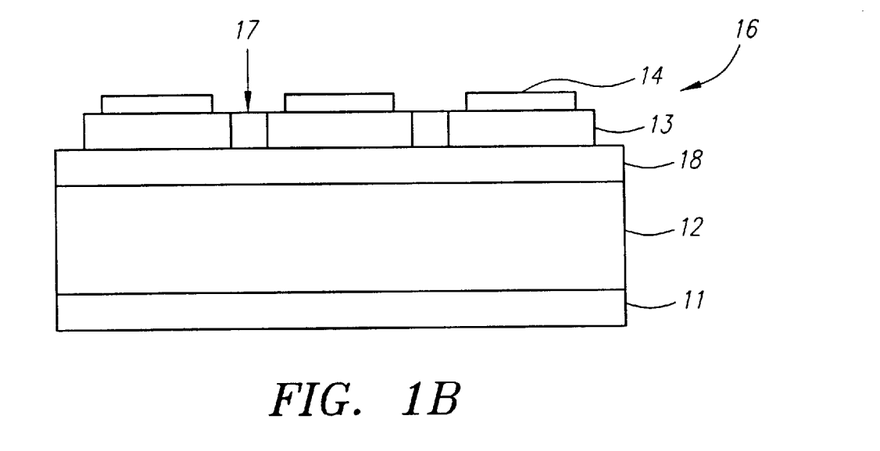
Figure 2:
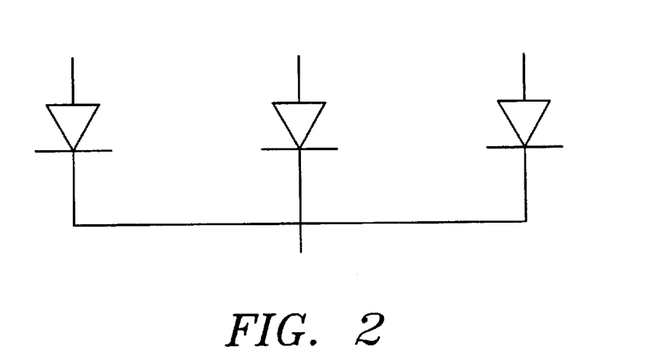
FIG. 2 illustrates a circuit diagram of a parallel LED array.

Conventional light emitting diode (LED) materials, such as GaAs, have allowed the construction of only single junction or multiple parallel junction devices when fabricated monolithically. FIG. 1A illustrates a typical multiple parallel junction LED array 10. Several p-type regions 13 are grown over a common n-type region 18. N-contact 11 connects to n-type region 18 and several p-contacts 14 connect to p-type regions 13. The device is fabricating by forming n-type region 18 on a substrate 12, then forming a continuous p-type layer over the n-type region. The p-type layer is then divided into discrete regions by mechanically sawing or chemically etching trenches 15 between p-type regions 13. FIG. 1B illustrates another multiple parallel junction LED array 16. Instead of mechanical sawing or chemical etching, p-type regions 13 are electrically isolated from each other by diffusion. The monolithic arrays illustrated in FIGS. 1A and 1B are limited to the parallel configuration illustrated in FIG. 2 because the use of contacts on opposite sides of the device requires one common conductive layer, i.e., n- or p-layer.

SUMMARY

In accordance with the present invention, a series or parallel LED array is formed on an insulating or highly resistive substrate, such that both the p- and n-contacts for the array are on the same side of the array. The individual LEDs are electrically isolated from each other by trenches or by ion implantation. Interconnects deposited on the array connect the contacts of the individual LEDs in the arrays. In some embodiments, the LEDs are III-nitride devices formed on sapphire substrates. In one embodiment, the III-nitride devices are formed on high-resistance SiC or III-nitride substrates. In one embodiment, two LEDs formed on a single substrate are connected in antiparallel to form a monolithic electrostatic discharge protection circuit. In one embodiment, multiple LEDs formed on a single substrate are connected in series. The series array can operate at a higher voltage than a single LED of the same area, thus simplifying power supply design. In one embodiment, multiple LEDs formed on a single substrate are connected in parallel. In this embodiment, multiple p-type regions are formed on a single n-type region, such that the n-type region surrounds each of the p-type regions and interposes the p-type regions. In some embodiments, a layer of phosphor covers a portion of the substrate on which one or more individual LEDs are formed.

DETAILED DESCRIPTION

Materials systems currently of interest in the manufacture of high-brightness light emitting diodes (LEDs) capable of operation across the visible spectrum are Group III–V semiconductors, particularly binary, ternary, and quaternary alloys of gallium, aluminum, indium, and nitrogen, also referred to as III-nitride materials. The III-nitride semiconductor layers referred to herein are compounds represented by the general formula $Al_xGa_yIn_{1-x-y}N$ ($0 \leq x \leq 1$, $0 \leq y \leq 1$, $0 \leq x+y \leq 1$), which may further contain group III elements such as boron and thallium and in which some of the nitrogen may be replaced by phosphorus, arsenic, or antimony. Typically, III-nitride devices are epitaxially grown on sapphire, silicon carbide, or gallium nitride substrates by metal-organic chemical vapor deposition (MOCVD), molecular beam epitaxy (MBE), or other epitaxial techniques. Sapphire substrates are often used because of their wide availability and ease of use. Sapphire is an insulator. application Ser. No. 09/469,657, entitled "III-Nitride Light Emitting Device with Increased Light Generating Capability," filed Dec. 22, 1999 on an invention of Krames et al., and incorporated herein by reference, discloses III-nitride light-emitting devices grown onto high-refractive-index substrates which have low optical absorption. These substrates may be SiC or III-nitride materials and have high electrical resistance due to the low impurity content. III-nitride devices grown on insulating or highly resistive substrates must have both the positive and the negative polarity electrical contacts to the epitaxially-grown semiconductor on the same side of the device. In contrast, semiconductor devices grown on conducting substrates such as those shown in FIGS. 1A and 1B are typically fabricated such that one electrical contact is formed on the epitaxially grown material and the other electrical contact is formed on the substrate.

Figure 3:
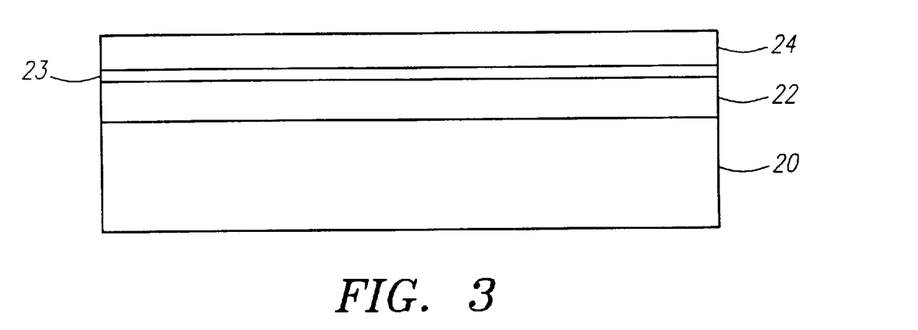
FIGS. 3–6 illustrate an embodiment of a series LED array according to the present invention at various stages in fabrication.

With the use of insulating or highly resistive substrates, III-nitride monolithic LED arrays may be fabricated by forming trenches or ion implantation regions between the individual LEDs to electrically isolate the individual LEDs. FIGS. 3–7 illustrate the fabrication of a III-nitride monolithic LED array in accordance with one embodiment of the present invention. In FIG. 3, an n-type layer 22 of, for example, GaN doped with Si, Ge, or O is formed overlying highly resistive substrate 20. An active layer 23 of, for example, InGaN is then formed overlying n-type layer 22, and finally a p-type layer 24 of, for example, AlGaN doped with Zn, Mg, Be, Ca, or Cd is formed overlying the active layer. Layers 22, 23, and 24 may actually contain several sublayers of different composition and dopant concentration which are omitted for clarity. For example, n-type layer 22 may include, a nucleation layer, a highly resistive GaN layer (e.g. a GaN layer that is non-intentionally doped), and a lightly n-doped layer, then a more heavily doped n-layer. Active layer 23 may be, for example, a multiple quantum well structure.

Figure 4:
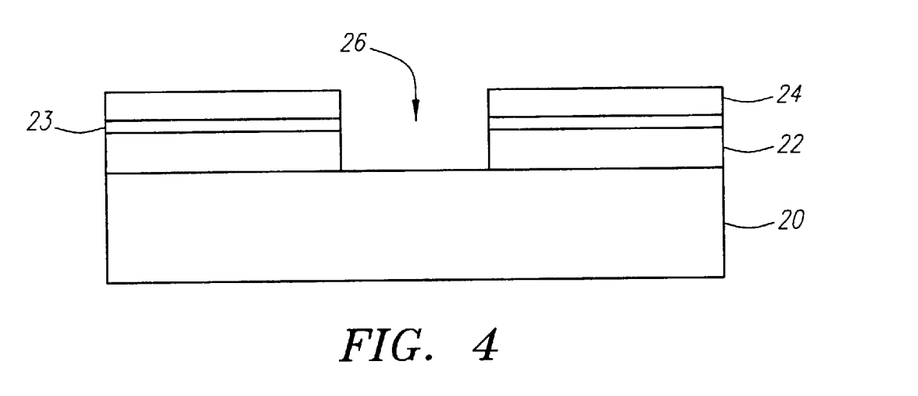
Figure 5:
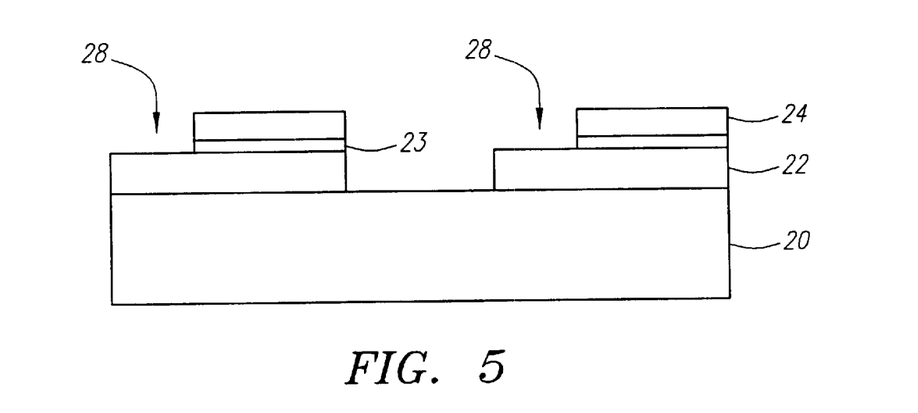

In FIG. 4, a portion of the n-type layer 22, the active layer 23 and p-type layer 24 is etched away to form a trench 26. The etch used may be, for example, a reactive ion etch with a chlorine-containing etchant gas such as $BCl_3$. Trench 26 is wide enough to electrically isolate the semiconductor layers on either side of the trench. Trench 26 is etched down to the substrate or to a highly resistive layer underlying n-type layer 22, such as a non-intentionally doped GaN layer. Similarly, the adjacent LEDs may be electrically isolated by use of an ion implantation process which can render the intervening material to be highly resistive. A portion of p-type layer 24 and active layer 23 of each remaining island of semiconductor material is then etched away as illustrated in FIG. 5 using, for example, a reactive ion etch. The second etch exposes ledges 28 on n-type layer 22, where n-type contacts are eventually formed.

Figure 6:
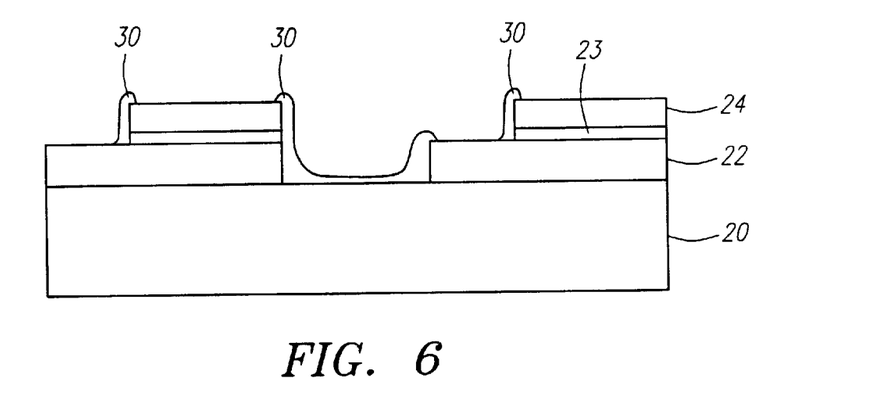

Turning now to FIG. 6, the ledges for n-contact formation are electrically isolated by depositing a dielectric material 30 over the device. The dielectric is then patterned and removed in places to open contact holes on n-type layer 22 and p-type layer 24, such that dielectric 30 is left in trench 26 between the individual LEDs on the substrate and on the mesa walls between the exposed p-type layer and n-type layer of each LED. Dielectric 30 may be, for example, oxides of silicon, nitrides of silicon, oxynitrides of silicon, aluminum oxide, or any other suitable dielectric material.

Figure 7A:
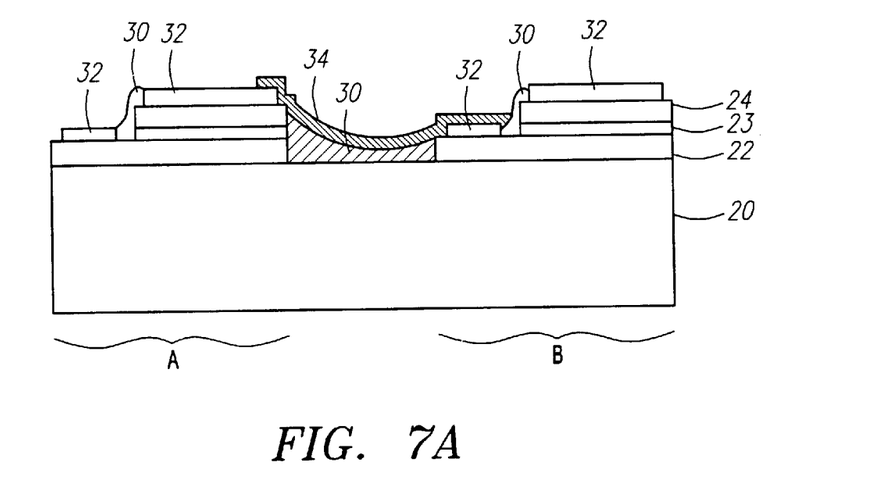
FIGS. 7A and 7B illustrate two embodiments of series LED arrays.
Figure 7B:
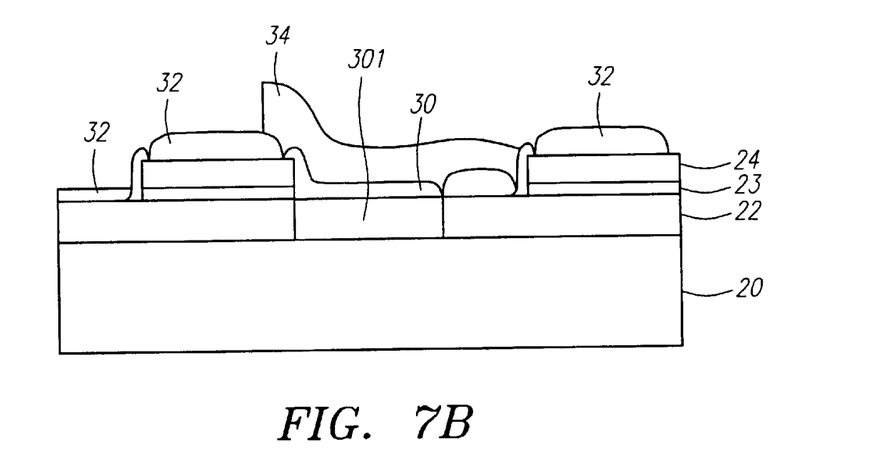

FIGS. 7A and 7B show two examples of completed series LED arrays. FIG. 7A illustrates a device where the LEDs in the array are separated by trenches. FIG. 7B illustrates a device where the LEDs in the array are separated by ion implantation regions 301. Electrode materials are deposited and patterned to form p- and n-contacts 32. Typical contact materials are Al or Ti—Al for the n-contact and Ag, Au, Ni, Pt, or alloys thereof for the p-contact. Contacts 32 may be transparent, such as in devices where light is extracted through the surface of the epitaxial layers, or reflective, such as in flip-chip devices where light is extracted through the substrate. After depositing and patterning the contacts, an array of unconnected light emitting diodes has been formed on a single substrate. Other process flows can be used to develop the same final structure. The LEDs can then be connected in many different configurations.

Interconnects 34 to connect the individual LEDs on the device are then deposited. Interconnect 34 may be, for example Al, Cu, Au, Ag or alloys such as AlSiCu. P- and n-contacts 32 are materials optimized to form ohmic contact with the semiconductor layers, while interconnect 34 is a thick, highly conductive material optimized for carrying current. If light is extracted from the device through transparent contacts, interconnect 34 is deposited to block as little of the contacts as possible to minimize the amount of light absorbed in the interconnect. The two LEDs illustrated in FIGS. 7A and 7B are connected in series, with the n-contact of LED B connected to the p-contact of LED A. As is apparent, metal interconnects 34 can be deposited to connect the LEDs of a monolithic array in many different configurations.

Figure 8A:
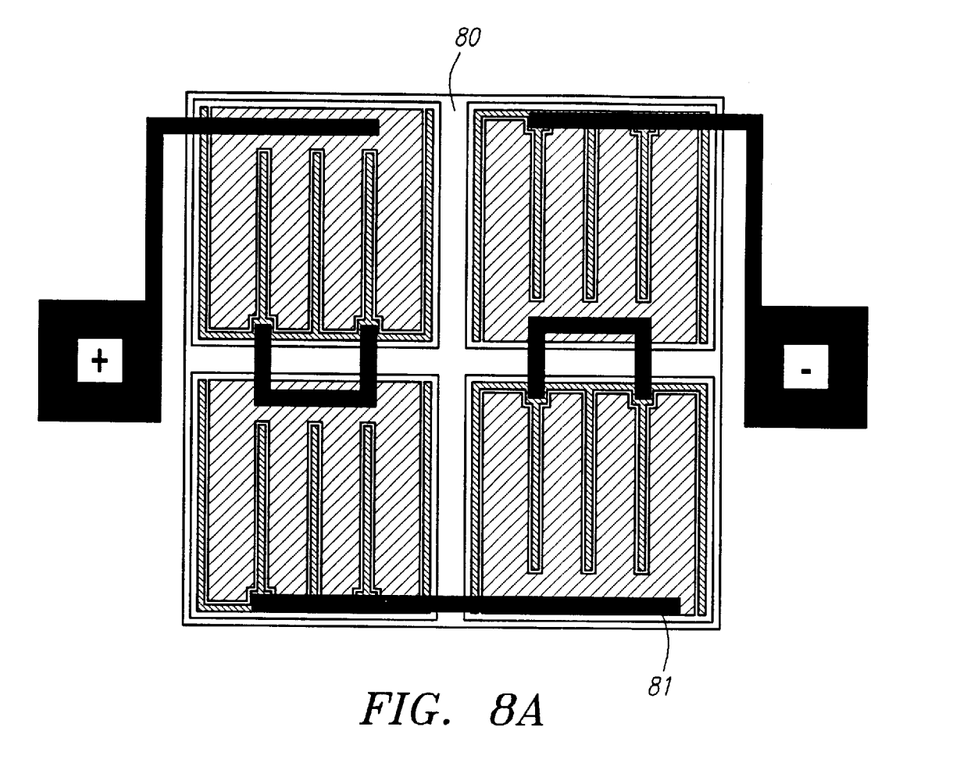
FIG. 8A illustrates a plan view of an embodiment of a series LED array.
Figure 8B:
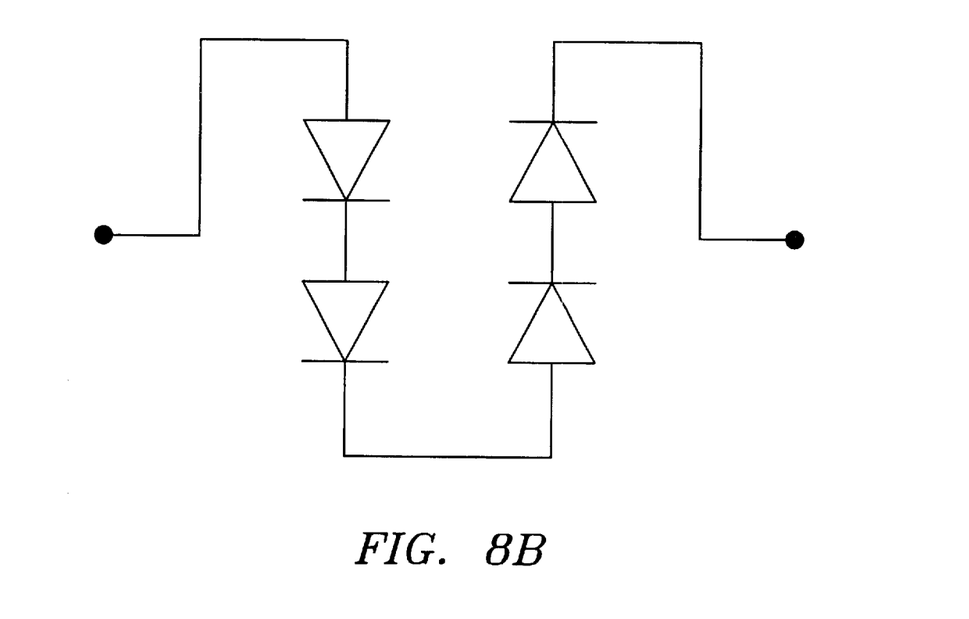
FIG. 8B illustrates a circuit diagram of a series LED array.

In one embodiment, such as that shown in FIGS. 8A and 8B, a series array of four LEDs is formed in a balanced square configuration. FIG. 8B shows a circuit diagram of four LEDs connected in series in a square array. FIG. 8A shows a plan view of one embodiment of FIG. 8B. It is desirable to minimize the largest dimension of the LED array, because after fabrication the array is packaged in an optic to direct light out of the packaged array. The optic typically grows geometrically with the size of the light source.

The array in FIG. 8A has four serially connected LEDs that are electrically isolated via etching to remove III-nitride material to form a trench 80 between the individual LEDs as described above in FIGS. 3–7A. The etching proceeds to at least a highly resistive III-nitride layer, such as a non-intentionally doped GaN layer. The electrical interconnections are provided by metallic traces 81. The resulting device may be represented by the electronic circuit shown in FIG. 8B. This device thus operates at 4× the voltage, and 4× less current, than a single LED of the same active region area. For example, a 1 $mm^2$ III-nitride LED may operate at 3.0 V and 350 mA. This same active junction area, broken up into four series-interconnected LEDs as shown in FIG. 8A, provides a device operating at 12.0 V and 87.5 mA. This higher voltage, lower current operation places less demand on the electronic driver circuit for the LED array. In fact, the electronic driver circuit can run at higher efficiency at higher voltages, improving the overall efficiency of the LED lighting system. A monolithic device, according to this embodiment, is preferred over a conventional approach of attaching individual LED dice in series. In the conventional approach, the total area taken up by the LED die is increased because of the tolerances required by die-attach machines. This undesirably increases the optical source size of the total LED and requires an increase in subsequent optics sizes in the LED system. In the preferred embodiment, the diodes may be spaced as closely together as allowed by the trench etching or ion implantation for electrical isolation. The trench or ion implantation region width may be as small as a few microns, so that the packing density of diodes in the embodiment can be very high.

In accordance with the invention, monolithic series arrays of LEDs may offer several advantages. First, monolithic arrays cut down on the number of connections to external circuitry, such as a submount. If the device is formed such that light is extracted from the epitaxial side of the device through transparent contacts, a reduction in the number of connections to external circuitry means that light can be extracted from more area of the device. In such devices, the LEDs are typically connected to external circuitry by wire bonds, which partially obscure the light which is usefully extracted from the LED die. Interconnects would typically obscure this extracted light to a much smaller extent. If the device is a flip chip, fewer contacts to the submount means that the device can have more active region to generate light. Second, as described above, monolithic serial arrays operate at a higher voltage than an individual LED. A higher operating voltage can simplify the design of a power supply to drive the LED array.

Figure 9A:
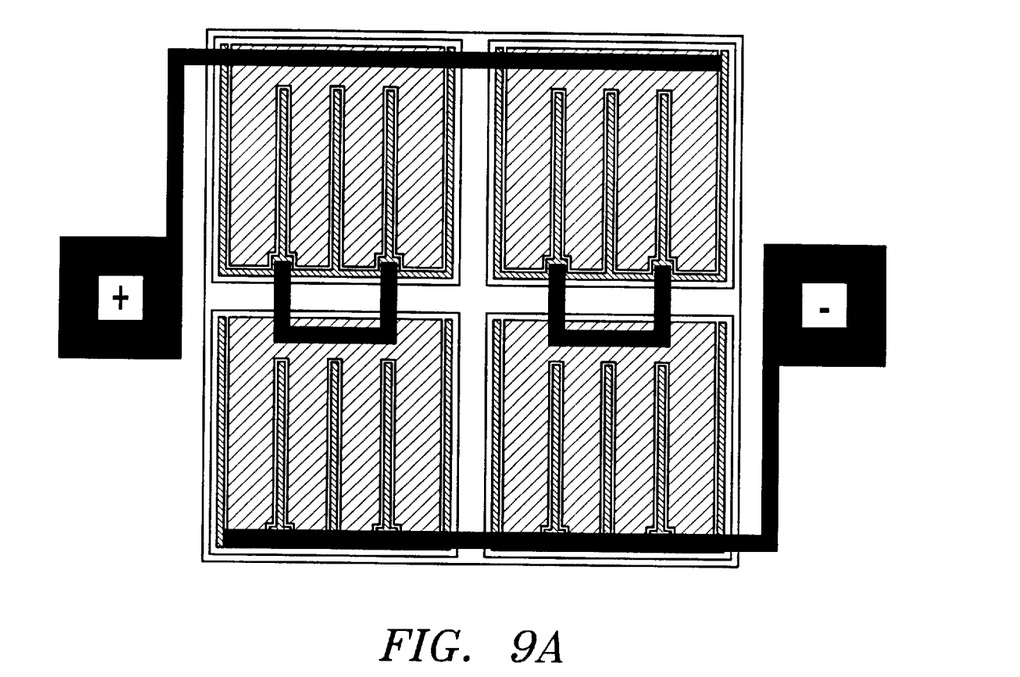
FIG. 9A illustrates a plan view of a series/parallel LED array.
Figure 9B:
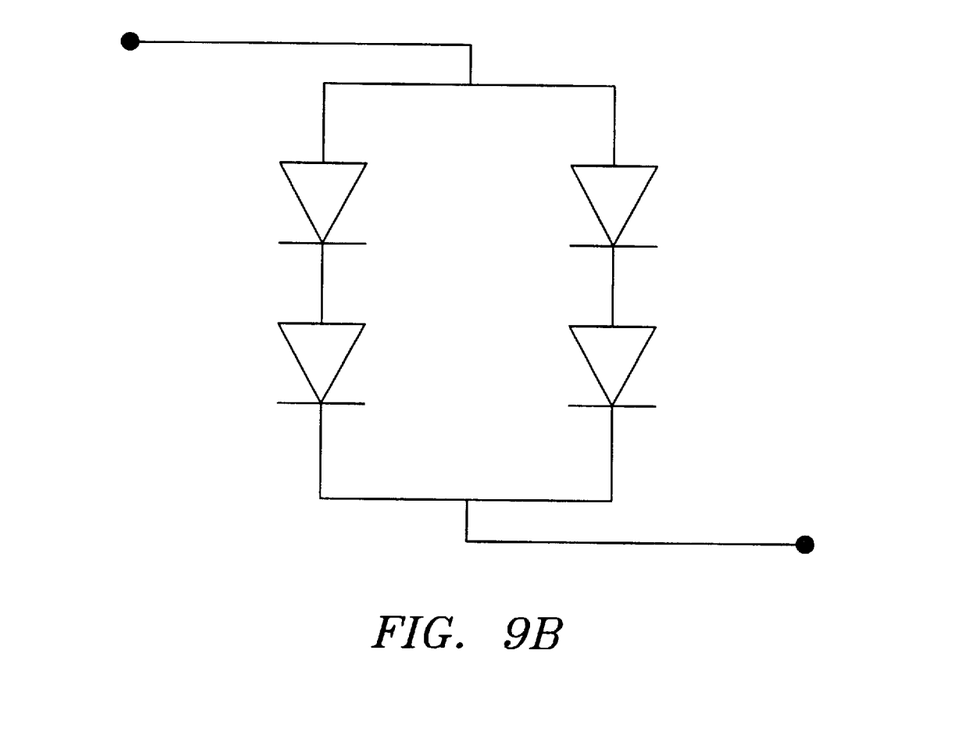
FIG. 9B illustrates a circuit diagram of a series/parallel LED array.

FIGS. 9A and 9B illustrate a balanced square series/parallel LED array. FIG. 9B shows a circuit diagram of four LEDs connected as two parallel strings of two LEDs connected in series. FIG. 9A shows a plan view of one embodiment of FIG. 9B. Such a series/parallel array is formed as described above in reference to FIGS. 3–7A.

Figure 10:
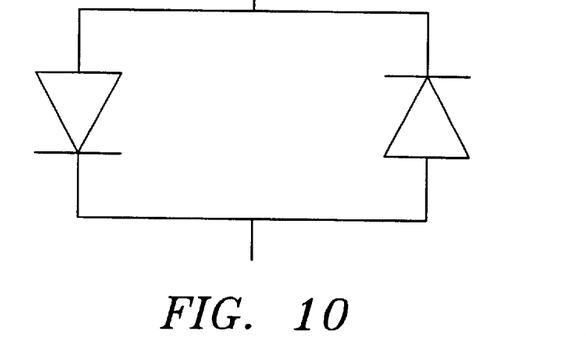
FIG. 10 illustrates a circuit diagram of a pair of antiparallel LEDs.
Figure 11:
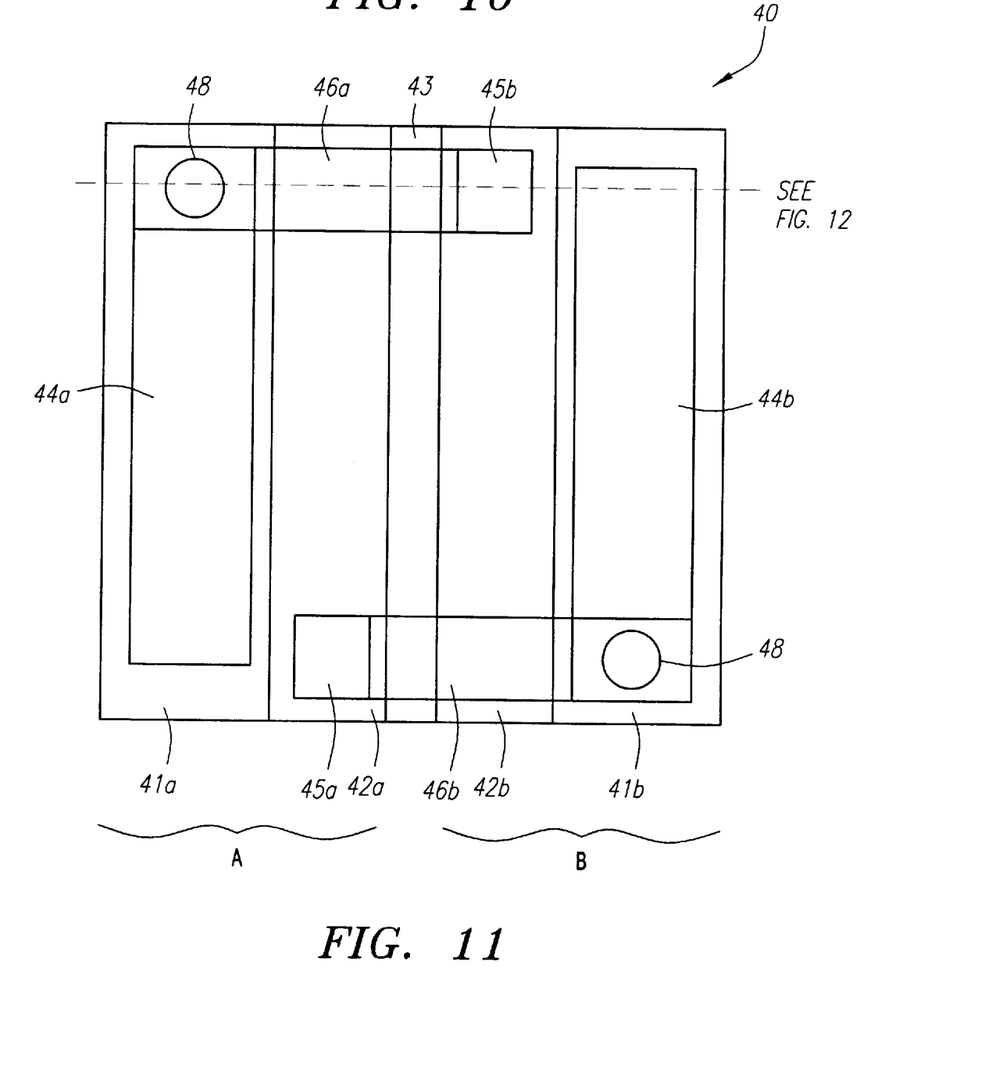
FIG. 11 illustrates a plan view of an embodiment of a monolithic ESD protection structure.
Figure 12:
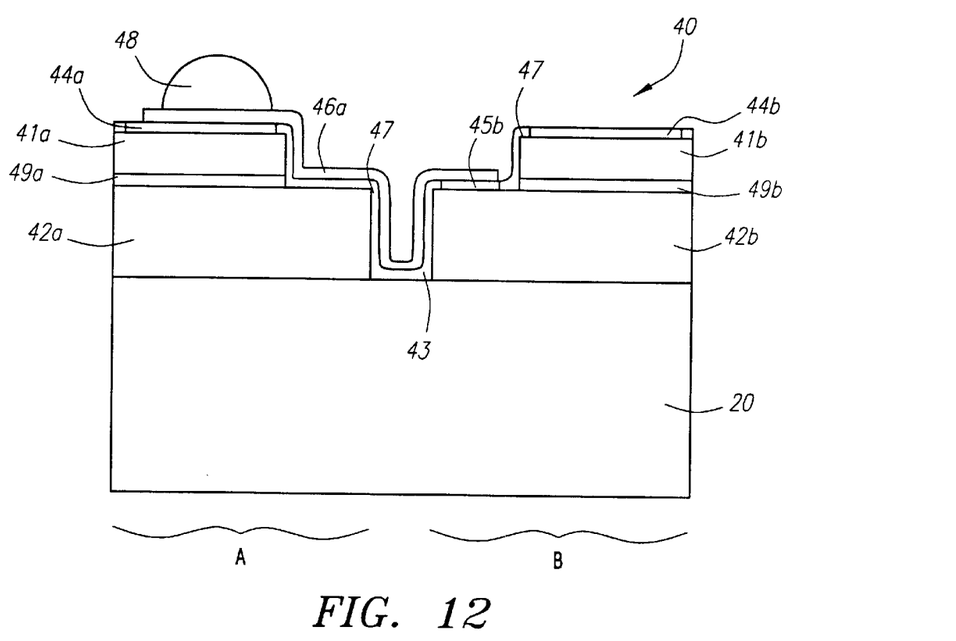
FIG. 12 illustrates a cross section of the structure shown in FIG. 11.

FIG. 10 illustrates an electrostatic discharge (ESD) protection circuit, where two diodes are connected in an anti-parallel configuration. The first LED clamps reverse breakdown in the second LED. FIGS. 11 and 12 illustrate one embodiment 40 of a monolithic ESD protection circuit.

Structures A and B are formed on a highly resistive substrate 20. One structure A is connected as an LED to produce light, while the other structure B is used to clamp reverse breakdown in LED A. P-type layers 41a and 41b overlay active regions 49a and 49b, which are formed on n-type layers 42a and 42b. A trench 43 is formed between devices A and B. Ledges for contact formation on n-type layers 42a and 42b are exposed such that the n-electrodes 45a and 45b are opposite trench 43 from each other. A dielectric layer 47 electrically insulates the metallization layer 46a from all electrical contact except where openings are made for interlayer interconnects, or for contacts to such areas as the p-contacts or n-contacts. P-electrode 44a and n-electrode 45b are connected by interconnect 46a such that the p-contact of LED A is connected to the n-contact of clamping device B. In the region where interconnect 46a is deposited, the n-contact of LED A is isolated from interconnect 46a by dielectric layer 47, as illustrated in FIG. 12. As shown in FIG. 11, the interconnection between the p-contact of LED A and the n-contact of clamping device B is formed on one side of the device, and the interconnection between the n-contact of LED A and the p-contact of clamping device B is formed on the other side of the device. The structure can then be connected to a submount or other structure (not shown) by solder bumps or wire bonds 48.

FIGS. 11 and 12 show a structure where the clamping device is the same size as the LED. Since the clamping device does not emit light in normal operating circumstances, the size of the clamping device can be reduced relative to the LED. In one embodiment, the p-n junction for the clamping device can be formed underneath a solder bump or wire bond 48, such that no useful light emitting area is lost. In another embodiment, the size of the two anti-parallel diodes is approximately equal and the device can be operated with an alternating current source.

Figure 13:
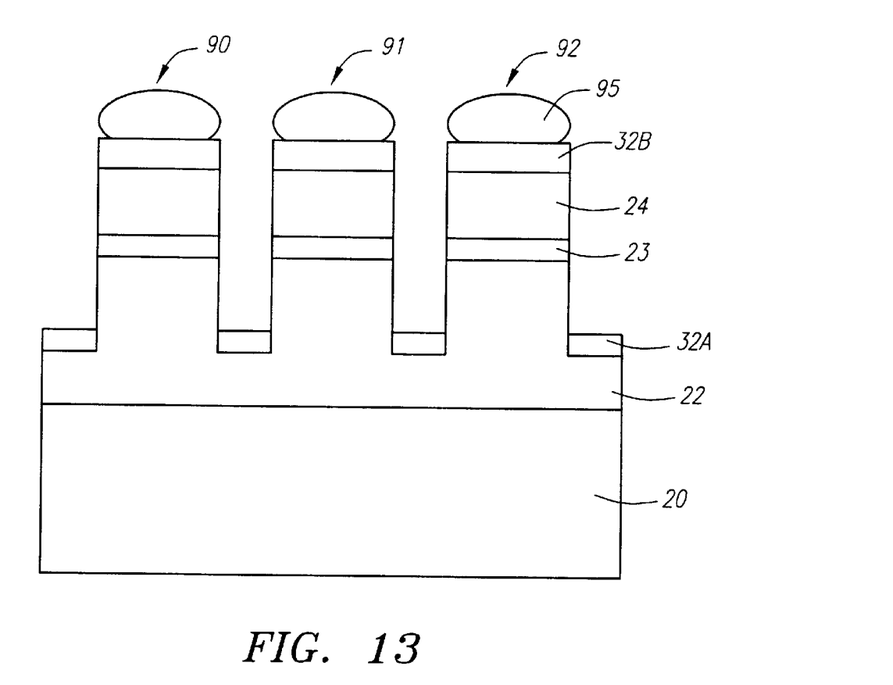
FIG. 13 illustrates a cross section of a parallel LED array.
Figure 14:
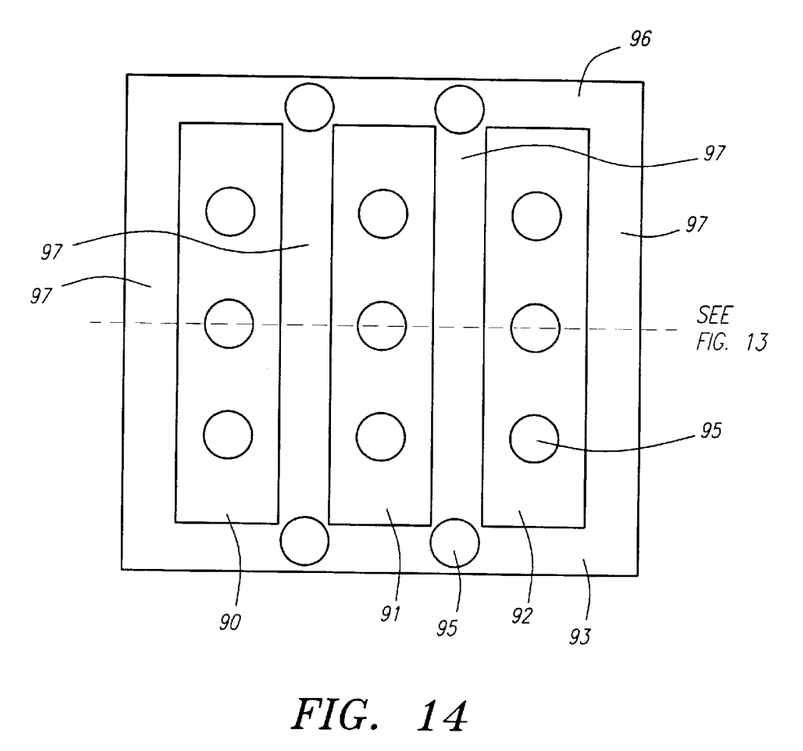
FIG. 14 illustrates a plan view of the structure shown in FIG. 13.

Parallel LED arrays may also be formed on highly resistive substrates. FIGS. 13 and 14 illustrate one embodiment of such an array. Three p-type regions 90, 91, and 92 are isolated from each other by a single continuous n-type region 93 interposing the p-type regions. P-contacts 32b deposited on p-type layer 24 and n-contacts 32a deposited on n-type layer 22 connect to a submount (not shown) by solder bumps 95. The submount may include control circuitry or appropriate connectivity for independently addressing each p-type region. In such embodiments, each LED may be operated independently of the others.

A single LED where the n-type region interposes portions of a single p-type region is described in application Ser. No. 09/469,657, filed Dec. 22, 1999 on an invention of Krames et al., titled "III-Nitride Light-Emitting Device with Increased Light Generating Capability,". The Krames et al. device lacks the top horizontal portion 96 of n-contact 93 and the top two solder bumps on the n-contact, shown in FIG. 14. As a result, current from the two lower n-contact solder bumps does not spread readily into the uppermost portions of the vertical arms 97 of n-contact 93. In fact, electromigration of the n-contact material can cut off all current flow into the vertical portions of the n-contact of such a device. In contrast, the symmetrical parallel junction device shown in FIG. 14 provides more avenues for current flow and increased redundancy. The top horizontal arm 96 of the n-contact eliminates "dead ends" at the tops of vertical arms 97, thus current spreads readily into all portions of the n-contact 93.

Figure 15:
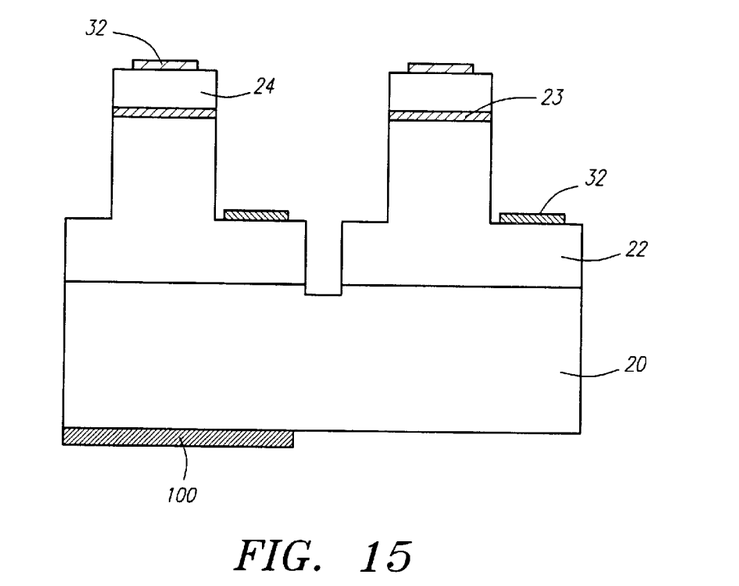
FIG. 15 illustrates a monolithic LED array with phosphor covering one of the individual LEDs.

One or more of the individual LEDs in either a series or a parallel monolithic array of LEDs can be covered with a phosphor to change the color of the light generated by the LED, as illustrated in FIG. 15. In a flip chip device, a phosphor coating 100 is printed on the bottom surface of a portion of the substrate on which a single LED in the array is formed. One method of applying phosphor coatings to the substrates of flip chip devices is described in more detail in application Ser. No. 09/688,053, filed on Oct. 13, 2000 on an invention of Lowery, titled "Stenciling Phosphor Layers on Light Emitting Diodes," and incorporated herein by reference. By applying a phosphor coating over some of the LEDs in a monolithic array, LED arrays can simultaneously generate different colors of light. Such an array may be useful to mix colors in order to form white light. For an LED array which incorporates independently addressable parallel LEDs coupled with selective phosphor placement, one may create color-tunable LED arrays.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention.

We claim:

1. An array of light emitting devices formed on a highly resistive substrate, the array comprising:
   a first light emitting device, comprising:
      a first n-type layer overlying a first portion of the substrate;
      a first active region overlying the first n-type layer;
      a first p-type layer overlying the first active region;
      a first n-contact connected to the first n-type layer;
      a first p-contact connected to the first p-type layer, wherein the first n-contact and the first p-contact are formed on the same side of the device;
   a second light emitting device, comprising:
      a second n-type layer overlying a second portion of the substrate;
      a second active region overlying the second n-type layer;
      a second p-type layer overlying the second active region;
      a second n-contact connected to the second n-type layer;
      a second p-contact connected to the second p-type layer, wherein the second n-contact and the second p-contact are formed on the same side of the device;
   one of a trench and an ion implanted region separating the first light emitting device and the second light emitting device; and
   a first interconnect connecting one of the first n- and first p-contacts to one of the second n- and second p-contacts.

2. The array of claim 1 wherein the first and second n-type layers, the first and second active regions, and the first and second p-type layers comprise III-nitride layers.

3. The array of claim 1 wherein the substrate is selected from the group consisting of sapphire, SiC, and III-nitride materials.

4. The array of claim 1 wherein the first interconnect connects the first p-contact to the second n-contact, the array further comprising a second interconnect connecting the second p-contact to the first n-contact.

5. The array of claim 4 further comprising a layer of dielectric material underlying a portion of the first and second interconnects.

6. The array of claim 1 wherein the first light emitting device and the second light emitting device are connected in series.

7. The array of claim 1 wherein the first light emitting device and the second light emitting device are connected in parallel.

8. The array of claim 1 further comprising a layer of phosphor coating a surface of the first portion of the substrate opposite the first n-type layer.

9. The array of claim 1 further comprising an highly resistive layer under the first n-type layer and the second n-type layer, wherein the highly resistive layer forms the bottom of the trench.

10. The array of claim 1 further comprising:
a third light emitting device, comprising:
a third n-type layer overlying a third portion of the substrate;
a third active region overlying the third n-type layer;
a third p-type layer overlying the third active region;
a third n-contact connected to the third n-type layer;
a third p-contact connected to the third p-type layer, wherein the third n-contact and the third p-contact are formed on the same side of the device;
a fourth light emitting device, comprising:
a fourth n-type layer overlying a fourth portion of the substrate;
a fourth active region overlying the fourth n-type layer;
a fourth p-type layer overlying the fourth active region;
a fourth n-contact connected to the fourth n-type layer;
a fourth p-contact connected to the fourth p-type layer, wherein the fourth n-contact and the fourth p-contact are formed on the same side of the device;
a second interconnect connecting the first n-contact to the third p-contact;
a third interconnect connecting the second n-contact to the fourth p-contact; and
a fourth interconnect connecting the third n-contact to the fourth n-contact;
wherein said one of a trench and an ion implanted region separates each of the first, second, third, and fourth light emitting devices from each other; and
wherein said first interconnect connects the first p-contact to the second p-contact.

11. An array of III-nitride light emitting devices formed on an highly resistive substrate, the array comprising:
a layer of a first conductivity type overlying the substrate;
a plurality of active regions overlying the layer of first conductivity type, such that an area underlying each active region in the plurality is surrounded by a portion of the layer of first conductivity type and portions of the layer of first conductivity type interpose areas underlying each active region in the plurality of active regions;
a plurality of layers of second conductivity type, overlying the plurality of active regions;
a first contact connected to the layer of first conductivity type; and
a plurality of second contacts connected to the plurality of layers of second conductivity type.

12. The array of claim 11 wherein the first contact surrounds an area underlying each active region in the plurality of active regions.

13. The array of claim 11 wherein the layer of first conductivity type comprises GaN doped with Si.

14. The array of claim 11 wherein the plurality of layers of second conductivity type comprise AlGaN doped with Mg.

15. The array of claim 11 wherein the plurality of second contacts comprise silver.

16. The array of claim 11 wherein the first contact comprises Al.

17. The array of claim 11 wherein the first contact comprises Ag.

18. The array of claim 11 wherein the substrate is selected from the group consisting of sapphire, SiC, and III-nitride materials.

19. The array of claim 11 further comprising a layer of phosphor coating a portion of a surface of the substrate underlying one of the plurality of active regions, the surface being opposite the layer of first conductivity type.

20. The array of claim 1 wherein the first interconnect overlies the trench or ion implanted region.

21. The array of claim 1 wherein the array is a monolithic structure.

22. The array of claim 21 wherein the first interconnect is part of the monolithic structure.

23. The array of claim 1 further comprising a layer of phosphor coating a surface of the substrate opposite the first and second light emitting devices, wherein, after conversion by the phosphor coating, each of the first and second light emitting device emits substantially the same color light.

24. The array of claim 11 wherein at least one of the plurality of layers of second conductivity type comprises InGaN.

* * * * *

INTER PARTES REEXAMINATION CERTIFICATE (732nd)
United States Patent
Collins, III et al.

(10) Number: US 6,547,249 C1
(45) Certificate Issued: Nov. 8, 2013

(54) MONOLITHIC SERIES/PARALLEL LED ARRAYS FORMED ON HIGHLY RESISTIVE SUBSTRATES

(75) Inventors: William David Collins, III, San Jose, CA (US); Jerome Chandra Bhat, San Jose, CA (US); Daniel Alexander Steigerwald, Cupertino, CA (US)

(73) Assignee: Philips Lumileds Lighting Company LLC, San Jose, CA (US)

Reexamination Request:
No. 95/001,732, Aug. 30, 2011

Reexamination Certificate for:
Patent No.: 6,547,249
Issued: Apr. 15, 2003
Appl. No.: 09/823,824
Filed: Mar. 29, 2001

(51) Int. Cl.
*H01L 21/28* (2006.01)
*H01L 21/3205* (2006.01)
*H01L 27/15* (2006.01)
*H01L 33/00* (2010.01)

(52) U.S. Cl.
USPC .......... 257/88; 257/89; 257/90; 257/97; 257/98; 257/99; 257/E27.121

(58) Field of Classification Search
None
See application file for complete search history.

(56) References Cited

To view the complete listing of prior art documents cited during the proceeding for Reexamination Control Number 95/001,732, please refer to the USPTO's public Patent Application Information Retrieval (PAIR) system under the Display References tab.

*Primary Examiner* — Michael J. Yigdall (57) ABSTRACT

Series or parallel LED arrays are formed on a highly resistive substrate, such that both the p- and n-contacts for the array are on the same side of the array. The individual LEDs are electrically isolated from each other by trenches or by ion implantation. Interconnects deposited on the array connects the contacts of the individual LEDs in the array. In some embodiments, the LEDs are III-nitride devices formed on sapphire substrates. In one embodiment, two LEDs formed on a single substrate are connected in antiparallel to form a monolithic electrostatic discharge protection circuit. In one embodiment, multiple LEDs formed on a single substrate are connected in series. In one embodiment, multiple LEDs formed on a single substrate are connected in parallel. In some embodiments, a layer of phosphor covers a portion of the substrate on which one or more individual LEDs is formed.

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 11 are determined to be patentable as amended.

Claims 2-10 and 12-24, dependent on an amended claim, are determined to be patentable.

New claim 25 is added and determined to be patentable.

1. An array of light emitting devices formed on a highly resistive substrate, the array comprising:
   a first light emitting device, comprising:
      a first n-type layer overlying a first portion of the substrate;
      a first active region overlying the first n-type layer;
      a first p-type layer overlying the first active region;
      a first n-contact connected to the first n-type layer;
      a first p-contact connected to the first p-type layer, wherein the first n-contact and the first p-contact are formed on the same side of the device;
   a second light emitting device, comprising:
      a second n-type layer overlying a second portion of the substrate;
      a second active region overlying the second n-type layer;
      a second p-type layer overlying the second active region;
      a second n-contact connected to the second n-type layer;
      a second p-contact connected to the second p-type layer, wherein the second n-contact and the second p-contact are formed on the same side of the device;
   one of a trench and an ion implanted region *forming a separation region* separating the first light emitting device and the second light emitting device; and
   a first interconnect *extending as substantially a linear section only along a peripheral edge portion of both of the first and second devices, across a narrow portion of the separation region along a peripheral edge of the separation region, and onto only the peripheral edge portion of the second device* connecting one of the first n- and first p-contacts to one of the second n- and second p-contacts.

11. An array of III-nitride light emitting devices formed on an highly resistive substrate, the array comprising:
   [a] *an elongated* layer of a first conductivity type *having a greater length than width* overlying the substrate;
   a plurality of *elongated* active regions *having a greater length than width, arranged in a longitudinally extending direction and* overlying the layer of first conductivity type, such that an area underlying each active region in the plurality is surrounded by a portion of the layer of first conductivity type and portions of the layer of first conductivity type interpose areas underlying each active region in the plurality of active regions;
   a plurality of *elongated* layers of second conductivity type *having a greater length than width, arranged in the longitudinally extending direction and* overlying the plurality of active regions;
   a first contact connected to the layer of first conductivity type; and
   a plurality of second contacts connected to the plurality of layers of second conductivity type; *and*
   *at least two of the second contacts arranged in the longitudinally extending direction and connecting to the same second conductivity type layer of the same device.*

*25. An array of light emitting devices formed on a highly resistive substrate, the array comprising:*
   *a first light emitting device, comprising:*
      *a first n-type layer overlying a first portion of the substrate;*
      *a first active region overlying the first n-type layer;*
      *a first p-type layer overlying the first active region;*
      *a first n-contact connected to the first n-type layer; and*
      *a first p-contact connected to the first p-type layer,*
      *wherein the first n-contact and the first p-contact are formed on the same side of the device and the same side of the device comprises a first plateau region of the first n type layer including said first n-contact and extending from under first p-type layer and including said first n-contact;*
   *a second light emitting device, comprising:*
      *a second n-type layer overlying a second portion of the substrate;*
      *a second active region overlying the second n-type layer;*
      *a second p-type layer overlying the second active region;*
      *a second n-contact connected to the second n-type layer; and*
      *a second p-contact connected to the second p-type layer,*
      *wherein the second n-contact and the second p-contact are formed on the same side of the device and the same side of the device comprises a second plateau region of the second n type layer including said second n-contact and extending from under the second p type layer and including said second n-contact;*
   *said first and second plateau regions having respectively said first and second n-type contacts thereon and said first and second plateau regions directly opposing each other across one of a trench and an ion implanted region separating the first light emitting device and the second light emitting device; and*
   *a first interconnect disposed across the first and second plateau regions and connecting one of the first n- and first p-contacts to one of the second n- and second p-contacts.*

\* \* \* \* \*